United States Patent
Baskaran et al.

(10) Patent No.: US 7,517,228 B2
(45) Date of Patent: Apr. 14, 2009

(54) SURFACE MOUNTED MICRO-SCALE SPRINGS FOR SEPARABLE INTERCONNECTION OF PACKAGE SUBSTRATE AND HIGH-SPEED FLEX-CIRCUIT

(75) Inventors: Rajashree Baskaran, Phoenix, AZ (US); Henning Braunisch, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 201 days.

(21) Appl. No.: 11/315,981

(22) Filed: Dec. 22, 2005

(65) Prior Publication Data

US 2007/0149000 A1    Jun. 28, 2007

(51) Int. Cl.
*H01R 12/00* (2006.01)
(52) U.S. Cl. .......................................... 439/67; 439/71
(58) Field of Classification Search ............. 439/67–71, 439/77
See application file for complete search history.

(56) References Cited

U.S. PATENT DOCUMENTS

| | | | | |
|---|---|---|---|---|
| 4,997,377 A | * | 3/1991 | Goto et al. | 439/68 |
| 5,207,585 A | * | 5/1993 | Byrnes et al. | 439/66 |
| 5,273,440 A | * | 12/1993 | Ashman et al. | 439/71 |
| 5,759,047 A | * | 6/1998 | Brodsky et al. | 439/66 |
| 6,347,946 B1 | | 2/2002 | Trobough et al. | 439/70 |
| 6,442,039 B1 | * | 8/2002 | Schreiber | 361/760 |
| 6,669,489 B1 | * | 12/2003 | Dozier et al. | 439/71 |
| 6,672,879 B2 | * | 1/2004 | Neidich et al. | 439/67 |
| 6,939,143 B2 | * | 9/2005 | Rathburn | 439/66 |
| 6,971,887 B1 | * | 12/2005 | Trobough | 439/71 |
| 7,248,481 B2 | * | 7/2007 | Trobough | 361/785 |
| 2001/0024892 A1 | * | 9/2001 | Ochiai | 439/67 |
| 2005/0264277 A1 | * | 12/2005 | Trobough et al. | 324/158.1 |
| 2005/0286239 A1 | | 12/2005 | Trobough | 361/785 |
| 2005/0287837 A1 | | 12/2005 | Trobough | 439/71 |

* cited by examiner

*Primary Examiner*—Tho D Ta
(74) *Attorney, Agent, or Firm*—Trop, Pruner & Hu, P.C.

(57) ABSTRACT

An integrated circuit may be coupled to a printed circuit board through a split socket. The integrated circuit may be packaged with a package substrate electrically coupled to a socket which, in turn, is electrically coupled to a printed circuit board. Between the printed circuit board and the package substrate, on the same side as the package substrate as the socket, may be positioned a flexible substrate. The flexible substrate may include a flexible sheet-like member made of a polymer, in one embodiment, and a plurality of microscale springs which electrically couple said flexible substrate to the package substrate.

15 Claims, 9 Drawing Sheets

SURFACE MOUNTED MICRO-SCALE SPRINGS FOR SEPARABLE INTERCONNECTION OF PACKAGE SUBSTRATE AND HIGH-SPEED FLEX-CIRCUIT

BACKGROUND

The present invention relates to, but is not limited to, electronic devices, and in particular, to the field of electronic connections.

In the current state of integrated circuit technology, electronic devices such as a central processing unit (CPU), volatile memory, system on chip (SOC), and the like, are typically assembled into electronic packages. These electronic packages commonly have a mating surface that is populated with conductive contacts or pads that are electrical contact points or interfaces for various signal, ground and power paths. The electronic packages and in some cases, the electronic devices themselves, are usually directly or indirectly mounted onto an underlying carrier or circuit board, such as, for example, a printed circuit board (PCB), a printed circuit card (PCC), a motherboard, and the like, via a surface mounted socket. The circuit boards, in turn, electrically couple these mounted electronic packages or electronic devices to other components via conductive interconnects that are typically embedded in and/or on the circuit board.

BRIEF DESCRIPTION OF THE DRAWINGS

Embodiments of the present invention will be described referencing the accompanying drawings in which like references denote similar elements, and in which.

DELAILED DESCRIPTION

According to various embodiments of the invention, a circuit board is provided that includes a multi-portioned receiver for receiving an electronic component, the multi-portioned receiver being coupled to an external substrate. For these embodiments, the external substrate may include a dielectric with a lower electrical loss tangent value than a dielectric that comprises the circuit board substrate. An electronic component, according to these embodiments, may be, for example, an electronic package that includes one or more electronic devices, heat dissipation components and one or more substrates. An electronic component may also be an electronic device without a package such as a die or a chip, a chipset, or any other electronic component having multiple conductive contacts or pads. An electronic device may be a central processing unit, system on chip (SOC), graphics processing unit (GPU), graphical co-processor, a digital signal processor, volatile memory, input/output device, chipset input/output hub, memory controller or other electronic devices. In various embodiments, the receiver, such as a socket, may be mounted on the circuit board, or may be embedded within the circuit board itself. The receiver may be comprised of at least two portions, at least one of the portions being detachable and coupled to the external substrate.

Figure 1:
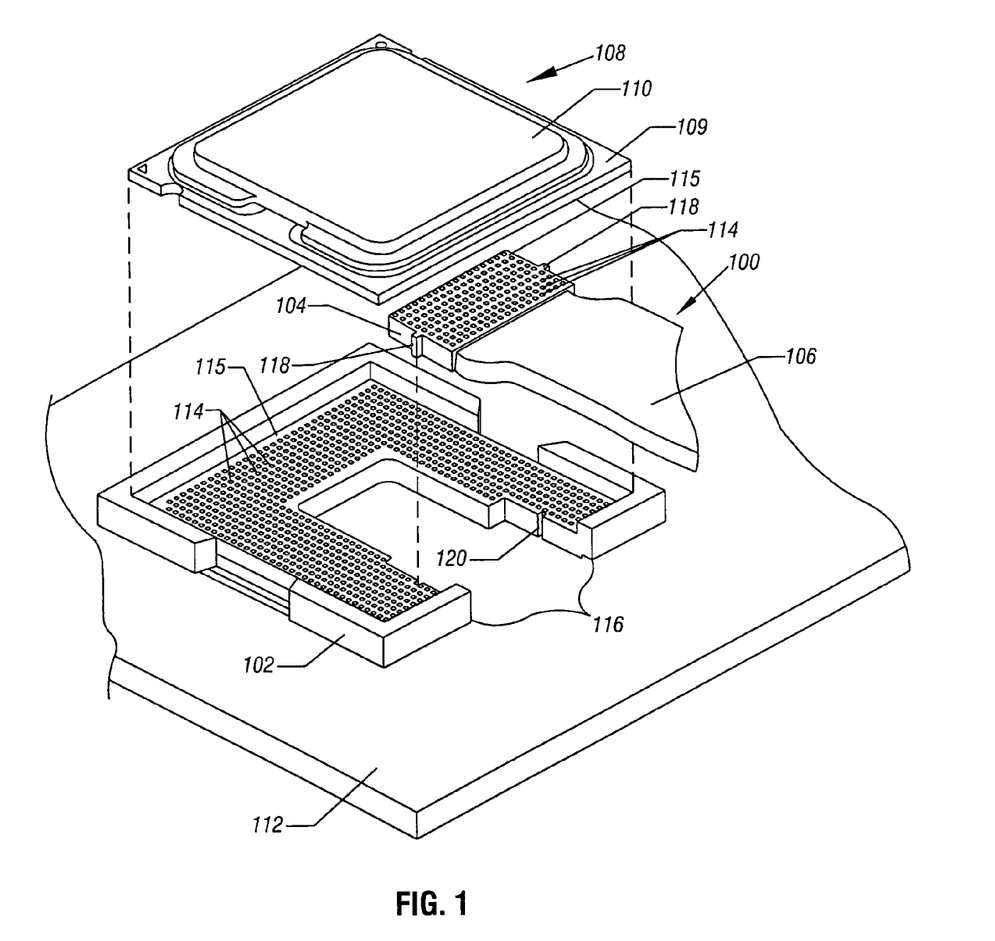
FIG. 1 is an exploded view of a portion of a circuit board assembly that includes a circuit board substrate and a first and a second socket element, the first socket element being attached to an external substrate in accordance with some embodiments.

FIG. 1 depicts an exploded view of a circuit board assembly that includes an electronic component and a receiver having two portions or elements, one of which is coupled to an external substrate, in accordance with various embodiments. In some embodiments, the receiver is a socket 100 that includes two socket elements, a first socket element 102 and a second, detachable socket element 104. The second socket element 104 may be electrically coupled to an external substrate 106, while the first socket element 102 may be electrically coupled to a circuit board substrate 112. The socket 100 may receive an electronic component 108 that includes, in this case, a package substrate 109, an electronic device (not shown) such as a central processing unit (CPU), and a heat spreader 110.

In these embodiments, the first socket element 102 has a U-shape with an adaptively shaped opening that allows the second socket element 104 to be received in the opening. When combined, the two socket elements 102 and 104 may form a socket having a substantially rectangular shape. In other embodiments, however, the first and second socket elements 102 and 104 may take on other shapes, thus resulting in a socket that may have a different shape other than a substantially rectangular shape. Thus, in some embodiments, split sockets may be used.

In some embodiments, the electronic component 108 may be but is not limited to a land grid array (LGA) package, a micro pin grid array (mPGA) package, a pin grid array (PGA) package, and any other type of packages or electronic device that may be mounted onto, for example, a socket. In various embodiments, the electronic component 108 may include a flip-chip or other types of chips such as a wire-bonded chip. The package substrate 109 may be made of one or more dielectric and/or ceramic layers. Interconnects, such as vias and traces, may be included in the package substrate 109 and may electrically couple the various signal, ground and power paths of the electronic device in the electronic component 108 to the socket 100. In some embodiments, the package substrate 109, along with its interconnects, may be configured to direct selected signals, such as higher speed signals that are transmitted to and from the electronic device through a particular portion of the package substrate 109, while slower speed signals, ground and power may be directed through other portions of the package substrate 109. In one embodiment, the substrate 109 is a coreless substrate.

Figure 2:
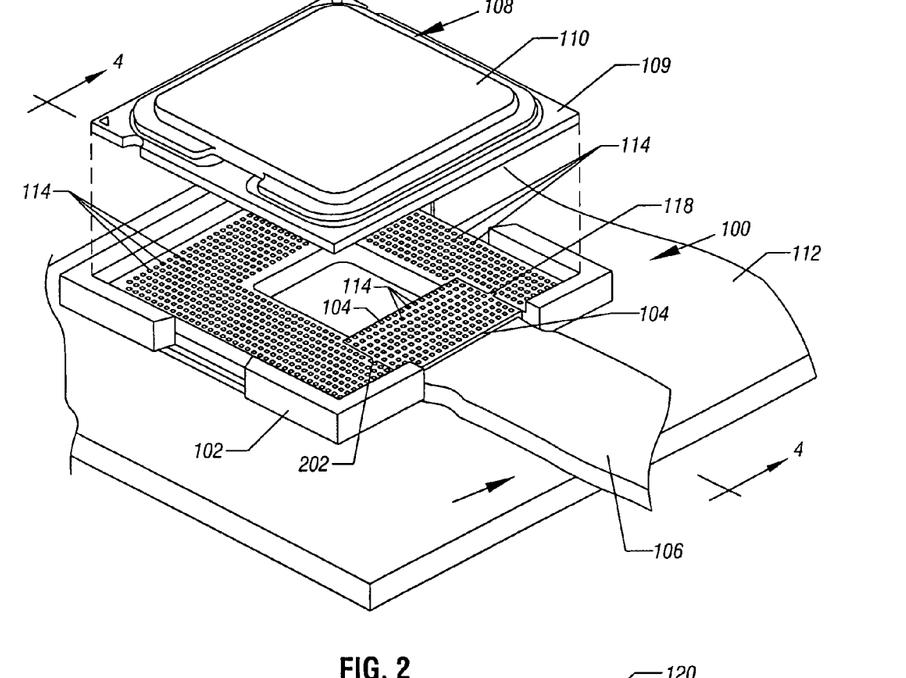
FIG. 2 illustrates the assembly of FIG. 1 when the second socket element has been coupled to the first socket element to form a complete socket in accordance with some embodiments.
Figure 3:
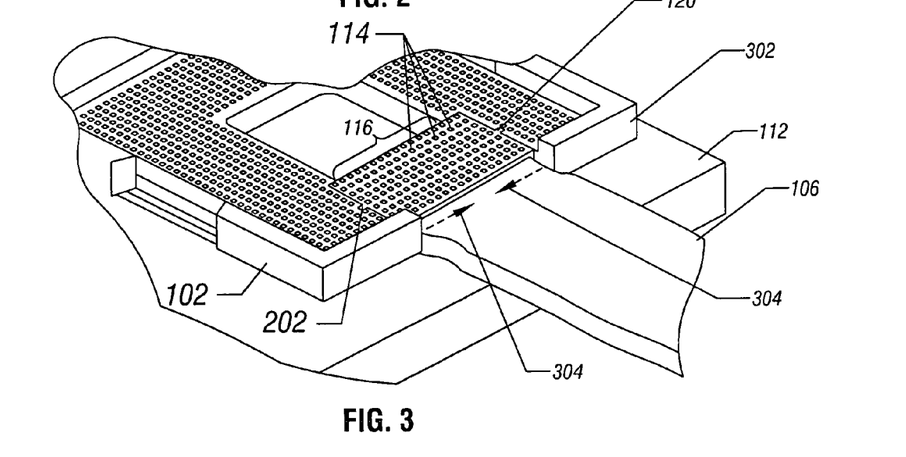
FIG. 3 illustrates the first and second socket elements of FIG. 2, in further detail, in accordance with some embodiments.
Figure 4:
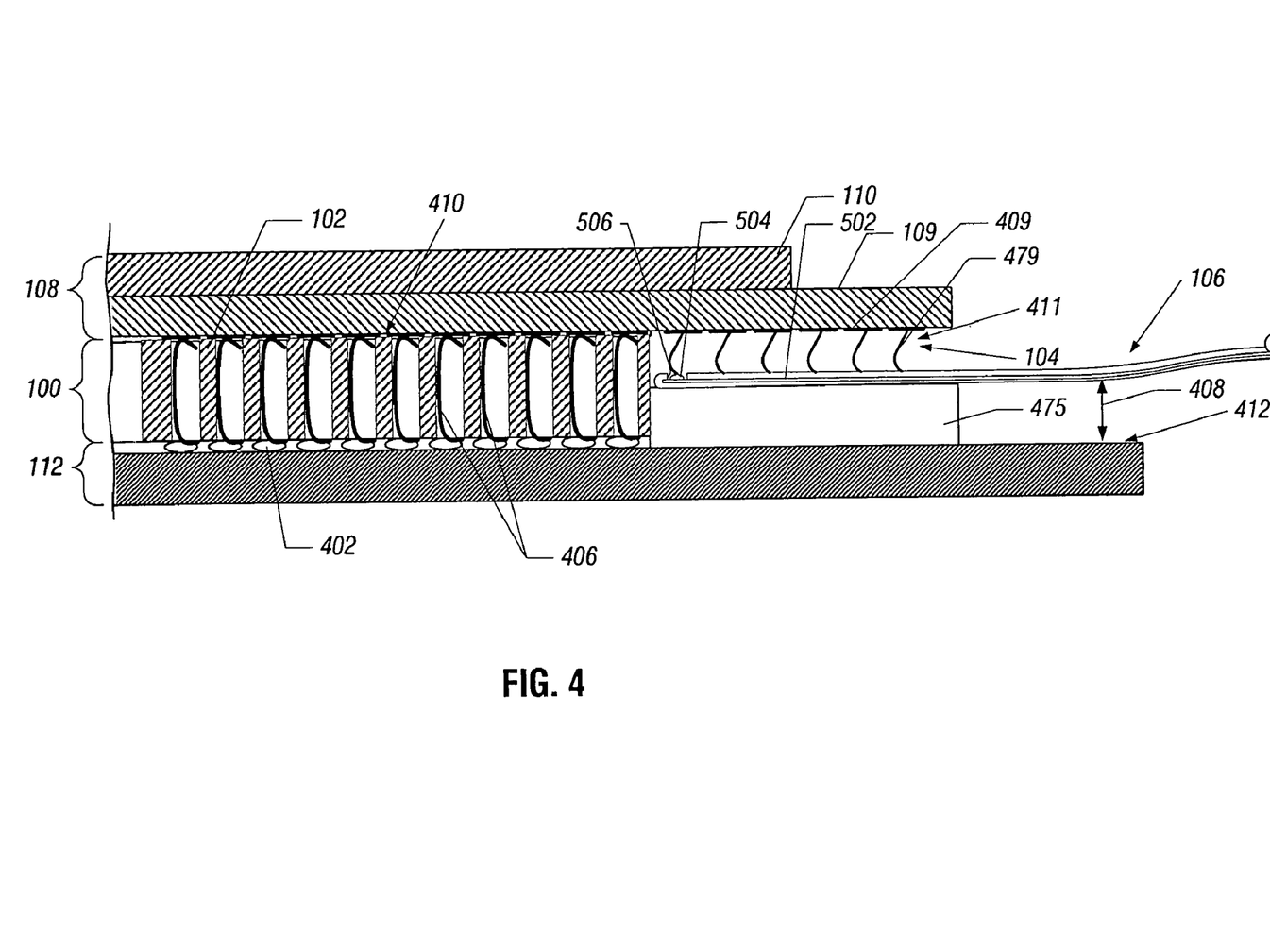
FIG. 4 illustrates a side view of an electronic component, socket and circuit board substrate in accordance with some embodiments.

In various embodiments, the socket 100 may receive electronic packages having multiple conductive contacts. For these embodiments a first socket element 102 and a second socket element 104 may combine to form the complete socket 100 (as depicted in FIG. 2). Each of the first and second socket elements 102 and 104 may include mating surfaces 115 (FIG. 1) that may interface with the package substrate 109 when the electronic component 108 is coupled to the first socket element 102 and the second socket element 104. In some embodiments, electrical contacts or connections, such as conductive elements or contacts (see FIG. 4, element 406), may be contained in apertures 114 of the first socket element 102 and microspring contacts 411 may be used in the second socket element 104 (FIG. 4). In some embodiments, the second socket element 104 may also have apertures 114, as shown in FIGS. 1 to 3, but this is not necessary.

The first socket element 102 may include a receiving feature such as a gap 116 where the second socket element 104 may be inserted. The gap 116 is depicted as being a complete cut-through that creates a disconnecting void in the first socket element 102 thus leaving the surface of the underlying circuit board substrate 112 exposed. However, in other embodiments, the gap 116 may not be a complete cut-through and thus will not result in the socket element 102 having a U-shape. Multiple socket elements may be inserted into the gap 116, each of the multiple socket elements may further be coupled to different substrates. The first socket element 102 and/or the second socket element 104 may mate such that the second socket element 104 fits into the gap 116 of the first socket element 102. For these embodiments, the second socket element 104 may include ears 118 that mate in notches 120 on the side walls of the first socket element 102, the notches 120 being part of the receiving feature (e.g., gap 116) of the first socket element 102.

In various embodiments, the receiving feature (e.g., gap 116) may be used to mate with or receive one or more socket portions (e.g., second socket element 104). Although the receiving feature is depicted as being a gap 116 in FIG. 1, in various other embodiments, the receiving feature may be an adaptedly shaped portion of the first socket element 102 that may receive or mate with additional socket portions. For example, in some embodiments, instead of a complete cut-through gap, the receiving feature may be a slot formed on the first socket element 102 where the second socket element 104 may be inserted. As will be recognized by those skilled in the art, other variations are also possible.

The circuit board substrate 112 may be electrically coupled to the first socket element 102 according to various embodiments. In some embodiments, the circuit board substrate 112 may be comprised of multiple interconnects, such as vias and traces, that are embedded in the circuit board substrate 112. These interconnects may represent separate signal, power and/or ground paths. In various embodiments, the circuit board substrate 112 may comprise of one or more layers of dielectrics. The dielectrics that make up the circuit board substrate 112 may have specific electrical loss tangent values associated with them. For example, according to one embodiment, the circuit board substrate 112 may be comprised of Fire Retardant-4 (FR4) dielectric having an electrical loss tangent value of about 0.020 to about 0.025.

According to some embodiments, the external substrate 106 may be external or physically detached from the circuit board substrate 112. In various embodiments, the external substrate 106 may be located adjacent to or on top of the surface of the circuit board substrate 112. The external substrate 106 may be comprised of multiple signal paths. For the embodiments, the external substrate 106 may further be comprised of a dielectric that may reduce signal loss, particularly when the signal or signals are being transferred at a high rate. In various embodiments, the electrical loss tangent value of the dielectric comprising the external substrate 106 may be a fraction of the electrical loss tangent value of the dielectric that comprises the circuit board substrate 112. In some embodiments, the electrical loss tangent for the dielectric comprising the external substrate 106 is less than or equal to 0.010. In one embodiment, for example, the electrical loss tangent is from about 0.001 to about 0.005. Dielectrics used for the external substrate 106 may include but are not limited to a polytetrafluoroethylene (PTFE) dielectric, a polyimide dielectric, a liquid crystal polymer (LCP) dielectric, and the like.

The external substrate 106, which may be physically detachable from the circuit board substrate 112, may be used to carry multiple signals between the electronic component 108 and, for example, other electronic devices according to some embodiments. In some embodiments, the signals being carried by the external substrate 106 may be signals of higher speed than signals that may be transmitted through the circuit board substrate 112 according to various embodiments. The speed of a signal relates to the amount of data being transferred per given time period (e.g., bits or data transferred per second). In one embodiment, signals may transfer through the external substrate 106 at a rate of at least 12 GT/s over a distance of around 6 inches. Of course, these numbers will vary depending upon several factors including for example, the type of material that comprises the external substrate 106.

In some embodiments, the first socket element 102 may facilitate slower speed signals destined for or originating from the electronic component 108 while higher speed signals destined for or originating from the electronic component 108 may be facilitated by the second socket element 104. For these embodiments, the references to higher speed signals and slower speed signals are in reference to the signals of different speeds that may be channeled through the first and second socket elements 102 and 104. In various embodiments, ground and power connection for the electronic component 108 may further be facilitated by the first socket element 102, even though the second socket element 104 may also include ground and power connections.

FIG. 2 depicts the first socket element 102 and the second socket element 104 of FIG. 1 combined or mated to form a complete socket 100 according to various embodiments. In some embodiments, the ears 118 (as shown in FIG. 1) of the second socket element 104 are inserted into the notches 120 (as shown in FIG. 1) of the first socket element 102, as indicated at 202, in FIG. 2. When the electronic component 108 is coupled to the socket 100, the second socket element 104 may carry or transmit signals to and from the electronic component 108. These signals may further be carried by the external substrate 106 to and from other components (not shown) that may be directly or indirectly coupled to the external substrate 106 and that may include the circuit board substrate 112. As previously discussed, in various embodiments, the signals that are facilitated by second socket element 104 and the external substrate 106 may be of higher speed than the signals that are facilitated by the first socket element 102 and the circuit board substrate 112.

FIG. 3 depicts the first socket element 102 and the second socket element 104 of FIG. 2, in further detail, according to some embodiments. In some embodiments, an aligning component or components may be included with the first socket element 102 and/or the second socket element 104 that may align and/or lock into place the second socket element 104. In one embodiment, the aligning components are the ears 118 (see FIG. 1) of the second socket element 104 and the notches 120 (see FIG. 1) of the first socket element 102. The ears 118 may be adapted to slide or fit into the notches 120 as indicated by ref. 202 in FIGS. 2 and 3. The notches 120 and the ears 118 may align the first socket element 102 with the second socket element 104. Various other aligning components, however, may be used to mate the second socket element 104 properly with the first socket element 102 in other embodiments. For example, in one embodiment, the retaining wall 302 of the first socket element 102, which may be used to hold in place the electronic component 108, may be extended inwardly as indicated by arrows 304. As a result, the retaining wall 302 may also facilitate holding in place, the second socket element 104. In such an embodiment, the width of the external substrate 106 may be correspondingly reduced to fit between the extended walls 302. In yet another embodiment, the notches 120 may be on the second socket element 104 instead of the first socket element 102 while the ears 118 are located on the first socket element 102 instead of on the second socket element 104 (see FIG. 1).

FIG. 4 depicts a cross-sectional view taken generally along the line 4-4, in FIG. 2, through the electronic component 108, socket 100 and circuit board substrate 112 of FIGS. 1 to 3 after being combined to form a circuit board assembly according to some embodiments. In some embodiments, the electronic component 108 is on top of the socket 100, which is further on top of the circuit board substrate 112. The electronic component 108, which comprises of one or more electronic devices such as a CPU or memory device, is electrically coupled to the package substrate 109. The socket 100 having the first socket element 102 that may be electrically coupled to the circuit board substrate 112 via solder joints 402. In some embodiments, the socket 100 further includes the second socket element 104, which is directly electrically coupled to the external substrate 106. The first socket element 102 may include multiple contacts 406 to electrically couple the package substrate 109 to the circuit board substrate 112. The ends of the contacts 406 may protrude out of the top and bottom surfaces of the first socket element forming contact elements for electrically coupling the package substrate 109 to the circuit board substrate 112.

The external substrate 106 may be electrically and physically coupled to the package substrate 109 by microscale springs 411. Each microscale spring 411 may include a wire bond connection 504, electrically coupled to the external substrate 106 on one side and to curved wires 479 on the other side. The curved tops of the microscale springs make spring biased contact with electrical contacts (not shown) in the package substrate 109. The microscale springs 411 may be made by wirebonding. For example, openings 506 may be formed on the external substrate 106 down to conductors 502 within the substrate. Then, a wirebond may be made to the exposed conductor, and formed to have a curved free end. A ball bond 504 or a wedge bond may be made directly to a conductor 502 within the external substrate 106.

A spacer portion 475 may position the circuit 106 and the microsprings 411 against the package substrate 109. The portion 475 may be made of resilient or elastomeric material. In some embodiments, spacer portion 475 may include electrical connections (not shown) that electrically couple external substrate 106 and circuit board substrate 112, thereby, for example, providing additional electrical paths between package substrate 109 and circuit board substrate 112.

In some embodiments, the second socket element 104 has a smaller height or thickness than the first socket element 102, for example, for improved high-speed performance. As a result of this difference in height, a gap 408 is formed between the second socket element 104 and the circuit board substrate 112. For these embodiments, one end of the external substrate 106 is placed in the gap 408 and the second socket element 104 may comprise the microsprings 411. The microscale springs may be small pitch (e.g., less than or equal to about 500 microns). The microscale springs may be variable compliance so that their degree of stiffness or resilience may be determined by the selection of materials or shapes, to give two examples. In various embodiments, the height or thickness of the second socket element 104 may be reduced such that the gap 408 may be widened to allow for, for example, a thicker external substrate 106 to be inserted into the gap 408.

The package substrate 109 may be comprised of multiple interconnects (not shown) such as vias and traces according to some embodiments. These interconnects may be associated with various signal, ground and power paths for the electronic device contained in the electronic component 108. For the embodiments, the interconnects, which may include traces and/or vias, may electrically couple the electronic device to the contacts 406 in the first socket element 102 and the second socket element 104 through conductive contacts (not shown) on the bottom surface of the package substrate 109. In some embodiments, selected signals such as higher speed signals traveling to and from the electronic component 108 may be channeled through the portion 409 of the package substrate 109 surface that interfaces the second socket element 106. For these embodiments, slower signals may be channeled through the package substrate 109 surface 410 that interfaces the first socket element 102. Further, ground and/or power may also be channeled through the package substrate 109 surface 410 that interfaces the first socket element 102.

In some embodiments, the external substrate 106 may be a flexible circuit. In one embodiment, the external substrate 106 is a flex circuit such as a polyimide-based flex circuit. In other embodiments, however, the external substrate 106 may be a non-flex circuit. An external substrate 106 that is a flexible circuit may provide certain beneficial characteristics in some embodiments. For example, in one embodiment, a flexible circuit may allow for additional space on the surface of the circuit board substrate 112 for mounting additional components onto the circuit board substrate 112. That is, by using a flexible circuit as the external substrate 106, additional components may be mounted on the surface of the circuit board substrate 112 underneath the external substrate 106 as indicated at 412. In addition, a flexible circuit may provide more tolerance for coupling the flexible circuit (i.e., external substrate 106) to other components. By providing extra tolerance, coupling of the external substrate 106 to other components may be facilitated by providing additional "slack" to properly couple with other components.

In some embodiments, the microsprings 411 may be partially encapsulated. For example, an integrated protective polymer/epoxy encapsulate (not shown) may be used.

Figure 5A:
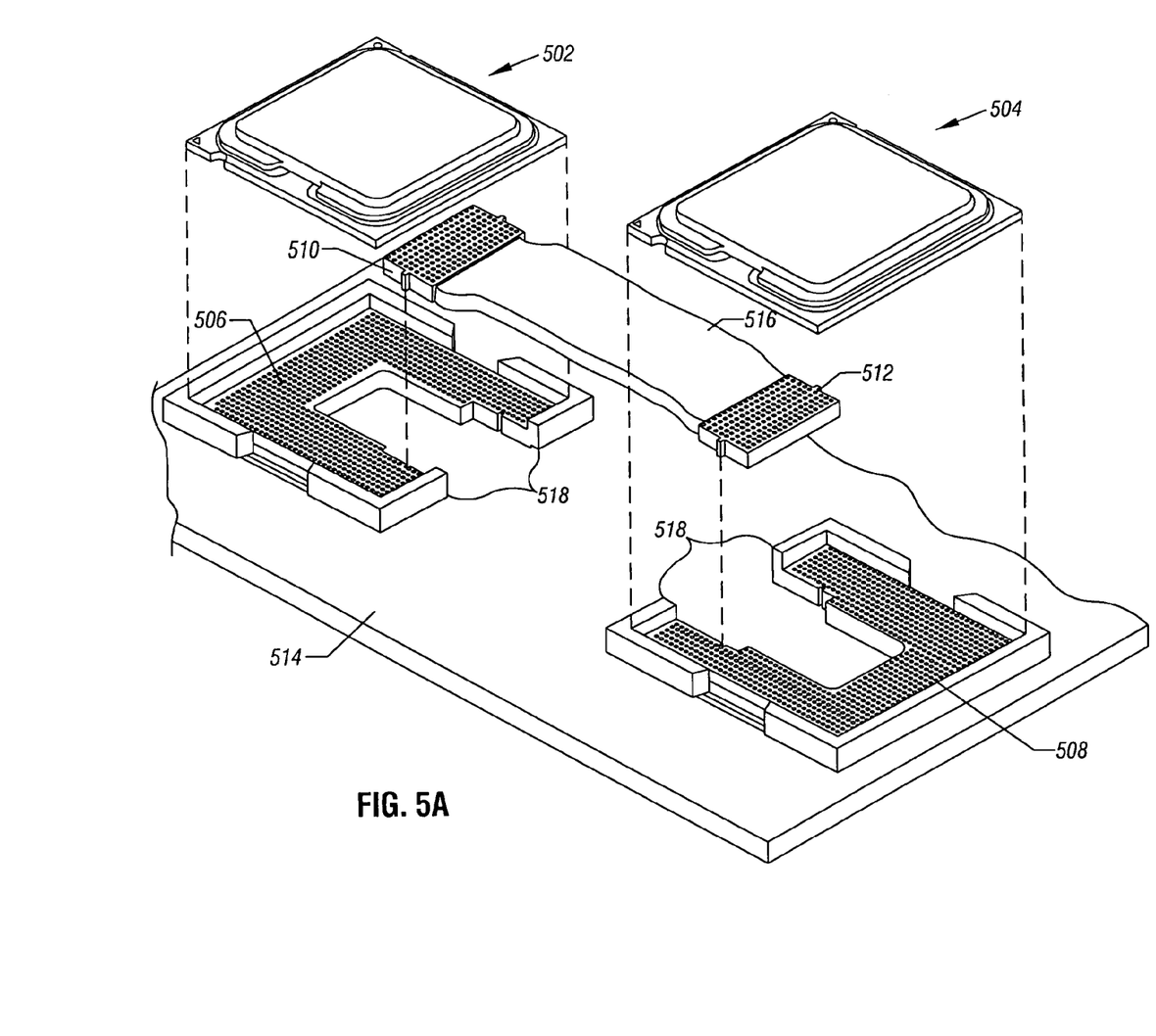
FIGS. 5A to 5D illustrate various views of a circuit board assembly in accordance with some embodiments.
Figure 5B:
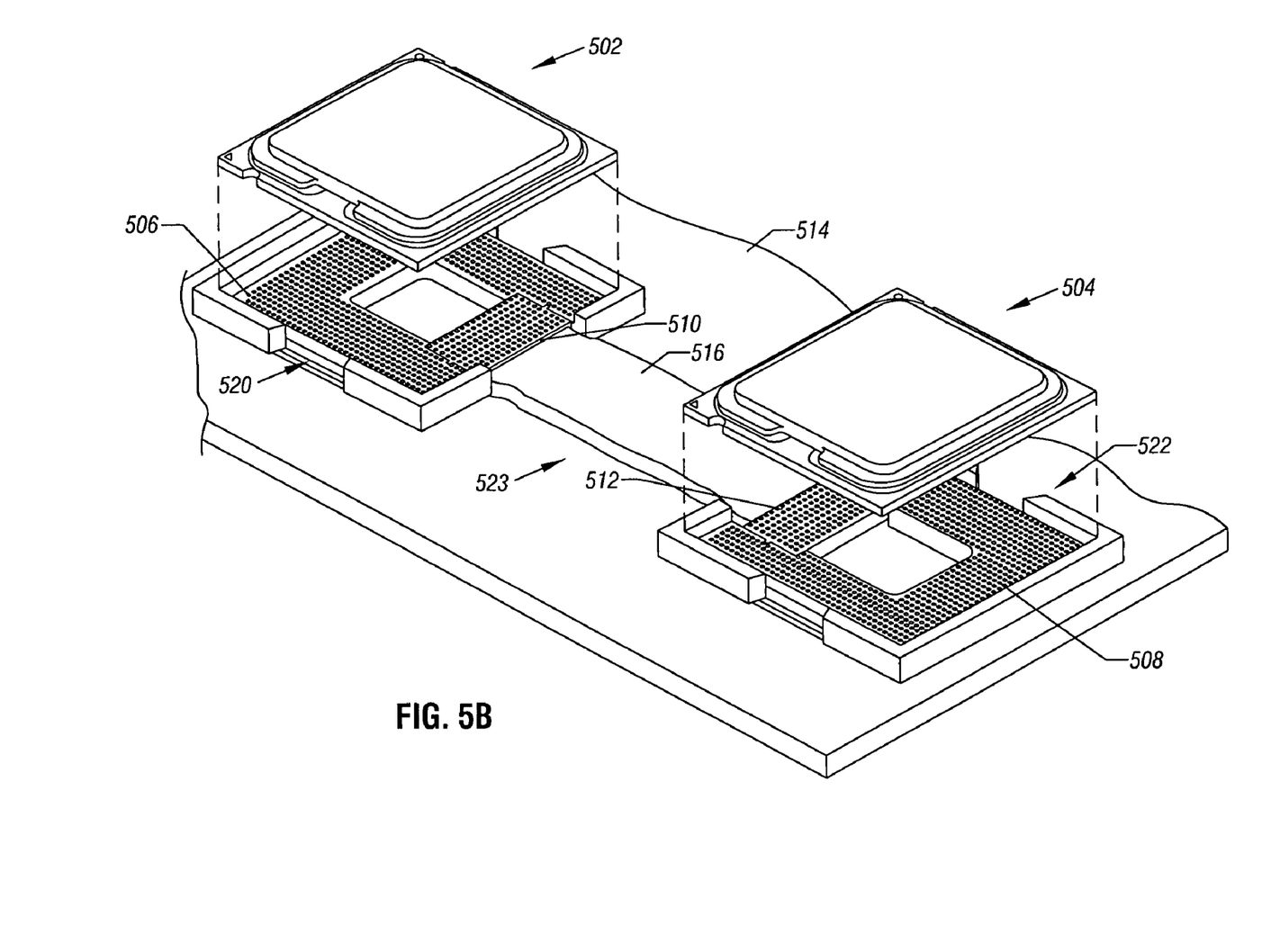
Figure 5C:
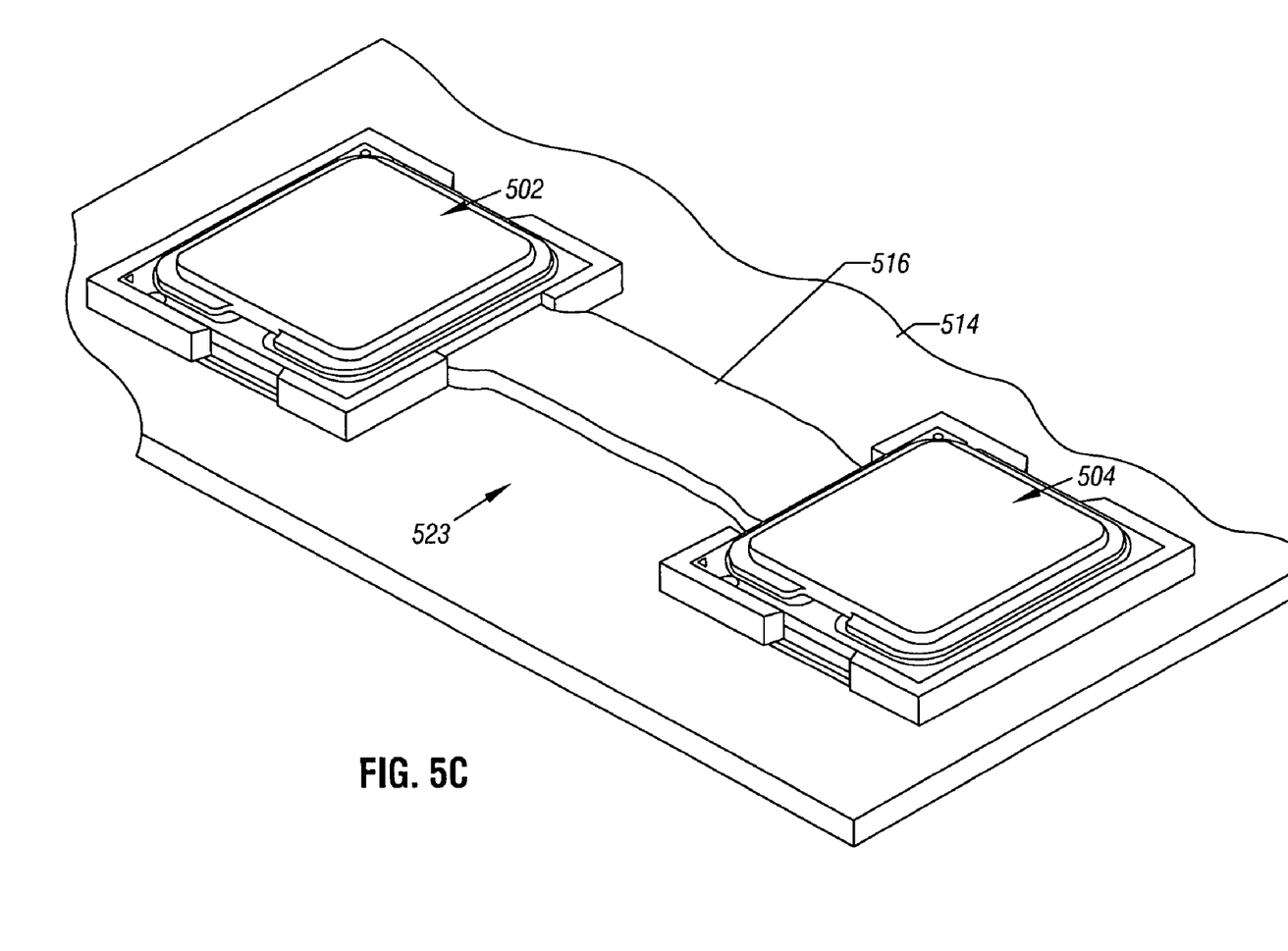

FIGS. 5A to 5C depict exploded and intact views of a circuit board assembly with two electronic components, in this case, two electronic packages, coupled together by two surface mounted receivers and an external substrate according to some embodiments. For these embodiments, two electronic packages, a first electronic package 502 and a second electronic package 504, are mounted on top of first socket elements 506 and 508 and second socket elements 510 and 512. The first socket elements 506 and 508 are on a circuit board substrate 514. The second socket elements 510 and 512 are coupled together by an external substrate 516. For the embodiments, the second socket elements 510 and 512 may be inserted into gaps 518 of the first socket elements 506 and 508 to form complete sockets 520 and 522 as depicted in FIG. 5B. The elements 510 and 512 may be, for example, high-speed connectors in a double compression configuration (board-to-board connectors).

In various embodiments, the external substrate 516 may be a flexible circuit that may facilitate the coupling of the external substrate 516 to the second socket elements 510 and 512. In some embodiments, additional components may be mounted onto the surface of the circuit board substrate 514 underneath the external substrate 516 (as indicated at 523 in FIGS. 5B and 5C).

In some embodiments, the external substrate 516 may transfer higher speed signals between the two electronic packages 502 and 504 through multiple signal paths that may be present in the external substrate 516. For these embodiments, slower signals, ground and/or power may transfer between the electronic packages 502 and 504 and/or other components through the first socket elements 506 and 508 and through the circuit board substrate 514.

Figure 5D:
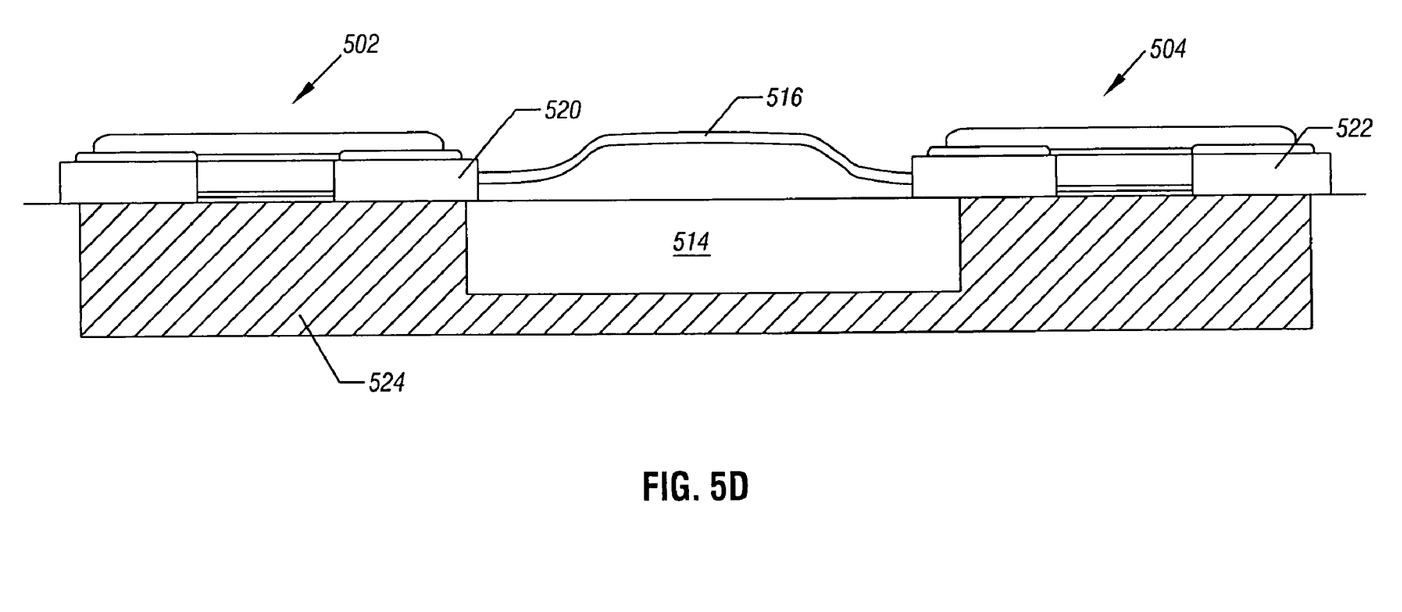

FIG. 5D depicts a partial, cross-sectional view of the circuit board assembly of FIGS. 5A to 5C in accordance with various embodiments. For these embodiments, the two electronic packages 502 and 504 are electrically coupled by the external substrate 516 and circuit board signal paths 524 that are integral of or embedded within the circuit board substrate 514. As previously described, in various embodiments, higher speed signals may transfer between the two electronic packages 502 and 504 through external substrate 516 while slower speed signals may transfer between the two electronic packages 502 and 504 via circuit board signal paths which, in this case, are conductive interconnects (such as vias and traces). Although not depicted, the circuit board signal paths 524 may further be coupled with other components and may facilitate ground and power for the electronic packages 502 and 504. Note that, although in FIG. 5D the circuit board signal paths 524 are depicted as being underneath the surface of the circuit board substrate 514, in other embodiments, one or more of the circuit board signal paths 524 may actually be located on the surface of the circuit board substrate 514.

In various embodiments, the circuit board signal paths 524 may include a plurality of traces and vias that form multiple signal paths between the two electronic packages 502 and 504. The circuit board signal paths 524 may also include one or more paths for ground and power, which may be directed away from the two electronic packages 502 and 504.

In addition to the embodiments described above, other configurations are possible in other embodiments. For example, in other embodiments, two electronic packages that are both bonded or soldered directly on to a circuit board substrate may also be coupled via an external substrate using, for example, two circuit board connectors. Further, in some embodiments, more than two electronic packages may be linked together on a circuit board substrate via multiple external substrates or an external substrate with several branches or arms.

Other embodiments include, for example, a socket that includes more than two socket elements such as a socket having three, four, five or more socket elements, where three or more of the socket elements may be coupled to three or more substrates. In such embodiments, the three or more substrates may be coupled to two or more electronic components thus linking the socket to multiple electronic components through three or more substrates.

Figure 6A:
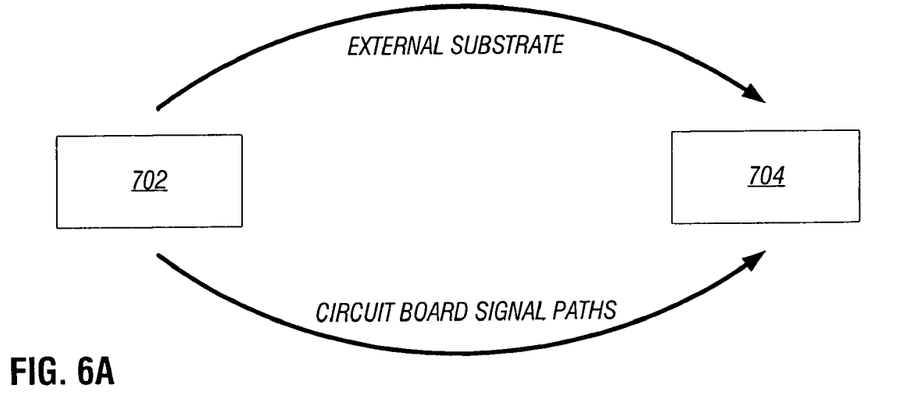
FIGS. 6A to 6C are block diagrams of signals being exchanged between two electronic components through an external substrate and circuit board signal paths in accordance with some embodiments.
Figure 6B:
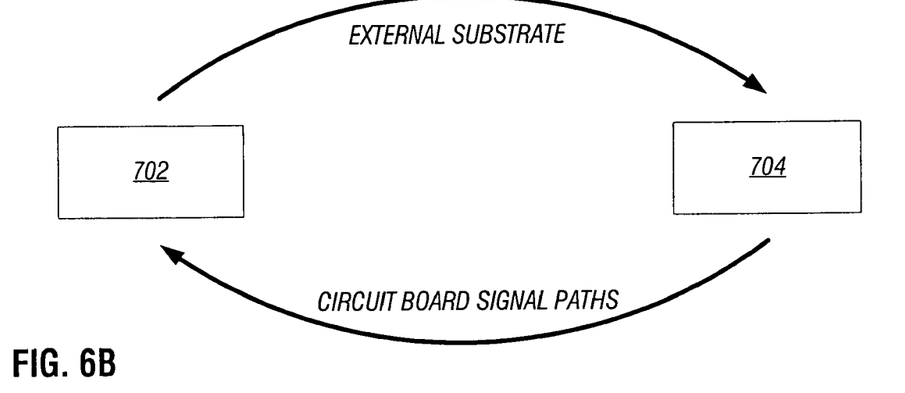
Figure 6C:
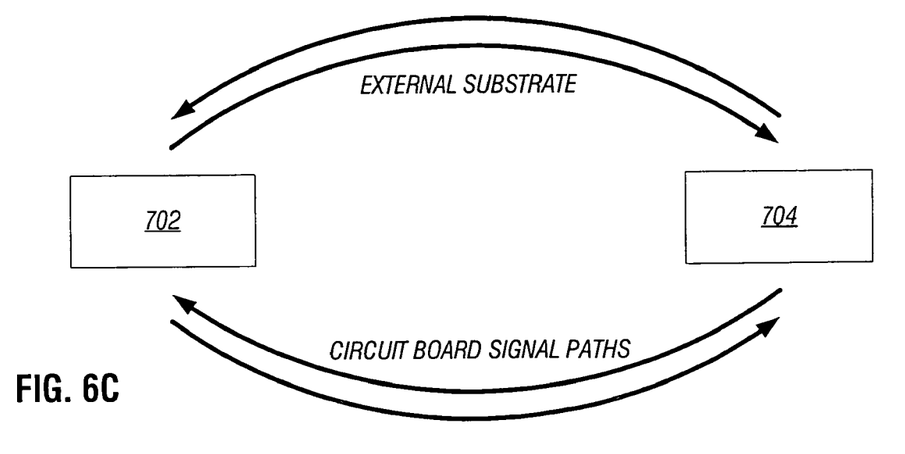

Referring to FIGS. 6A to 6C, depicting signals being exchanged between two electronic components 702 and 704 through two sets of signal paths, a plurality of external substrate signal paths and a plurality of circuit board signal paths according to various embodiments. For the embodiments, the external substrate signal paths and the circuit board signal paths being physically disjoined or separated from each other. In these embodiments, the external substrate signal paths and the circuit board signal paths may be bidirectional and/or unidirectional. In various embodiments, a plurality of signals having different speeds may be carried by each set of signal paths.

FIG. 6A depicts a first electronic component 702 transmitting signals to a second electronic package 704 via external substrate signal paths and circuit board signal paths as depicted in accordance with one embodiment. For this embodiment, the second electronic component 704 may be a slave or servant component to the first electronic component 702 only receiving signals from the first electronic component 702 and not transmitting signals to the first electronic component 702. As a result, for this embodiment, signals are only transmitted in one direction. In various embodiments, the transmitted signals carried through the external substrate signal paths may be signals of higher speed than the signals carried by the circuit board substrate paths. In some embodiments, signals of different speeds may even propagate within the same set of signal paths (e.g., external substrate signal paths or circuit board signal paths). Thus, for example, the external substrate signal paths may, by themselves, carry signals of different speeds.

According to another embodiment, the first electronic component 702 may transmit signals to the second electronic component 704 through only the external substrate signal paths and not through the circuit board signal paths as depicted in FIG. 6B. For this embodiment, the first electronic component 702 may, however, receive signals from the second electronic component 704 via the circuit board signal paths. In this embodiment, the external substrate signal paths and the circuit board signal paths are not bi-directional. That is, note that in this embodiment, all signals traveling through a particular set of signal path (i.e., the external substrate signal paths or the circuit board signal paths) are traveling in one direction only. Again, as in the embodiment depicted in FIG. 6A, signals being carried by the external substrate signal paths may be higher speed signals than the signals carried by the circuit board signal paths. Also again, each set of signal paths (e.g., external substrate signal paths or circuit board signal paths) may carry signals of different speeds.

According to another embodiment, each set of signal paths (external substrate signal paths and the circuit board signal paths) may allow bidirectional signal transmissions as depicted in FIG. 6C. For this embodiment, the first electronic component 702 may transmit or receive signals from the second electronic component 704 through both the external substrate signal paths and the circuit board signal paths. Again, as in the embodiments depicted in FIGS. 6A and 6B, signals being carried by the external substrate signal paths may be higher speed signals than the signals carried by the circuit board signal paths. Also again, each set of signal paths (e.g., external substrate signal paths or circuit board signal paths) may carry signals of different speeds.

In some embodiments, the signals being transmitted and received by an electronic component may use the same and/or different signal paths (i.e., external substrate signal paths and/or circuit board signal paths) for transmitting and receiving signals. For example, in some embodiments, the first electronic component 702 may use the same external substrate signal paths for transmitting and receiving signals to and from the second electronic component 704. Such signal paths may represent true bi-directional signal paths. Similarly, the first electronic component 702 may use the same circuit board signal paths for both receiving and transmitting signals to and from the second electronic component 704. In other embodiments, however, the first electronic component 702, may use, for example, only specific external substrate paths for receiving signals from the second electronic component 704, while other external substrate paths may be used only for transmitting signals to the second electronic component 704. Similarly, for such embodiments, some of the circuit board substrate paths may be dedicated for transmitting signals from the first electronic component 702 to the second electronic component 704 while other circuit board substrate paths may be dedicated for receiving signals by the first electronic component 702 from the second electronic component 704. In yet other embodiments, the signals paths used by, for example, the first electronic component 702 may include a combination of both bi-directional signal paths as well as one or unidirectional signal paths (external substrate signal paths and/or circuit board signal paths).

In the following, examples of different signaling schemes between the first and the second electronic components 702 and 704 via the circuit board signal paths and/or the external substrate signal paths are provided according to various embodiments.

In the first example, the first electronic component 702 transmits a plurality of first signals at a first signal speed through the circuit board signal paths to the second electronic component 704. The first electronic component 702 further transmits a plurality of second signals at a second signal speed through the external substrate signal paths to the second electronic component 704. In various embodiments, the second signal speed may be higher than the first signal speed. In some embodiments, the second electronic component 704 may transmit and the first electronic component 702 may receive, a plurality of third signals at a third signal speed via either the circuit board signal paths or the external substrate signal paths. If the plurality of third signals are received through the circuit board signal paths, then the third signal speed of the plurality of third signals may be lower than the second signal speed of the plurality of second signals and may be equal to the first signal speed of the plurality of first signals. In some embodiments, at least some of the first and third signals may be transmitted and received through the same signal paths (e.g., bi-directional circuit board signal paths). If, on the other hand, the plurality of third signals are received by the first electronic component 702 through the external substrate signal paths, then the third signal speeds of the plurality of third signals may be higher than the first signal speed of the plurality of first signals and may be equal to the second signal speed of the plurality of second signals. In some embodiments, at least some of the second and third signals may be transmitted and received thorough the same signal paths (e.g., bidirectional external substrate signal paths).

In a second example, the second electronic component 704 may transmit and the first electronic component 702 may receive, a plurality of first signals at a first signal speed via the circuit board signal paths. The second electronic component 704 may further transmit and the first electronic component 702 may further receive, a plurality of second signals at a second signal speed via the external substrate signal paths. In some embodiments, the first electronic component 702 may transmit and the second electronic component 704 may receive, a plurality of third signals at a third signal speed via either the circuit board signal paths or the external substrate signal paths. In some embodiments, the second signal speed of the plurality of second signals may be higher than the first signal speed of the plurality of first signals.

Figure 7:
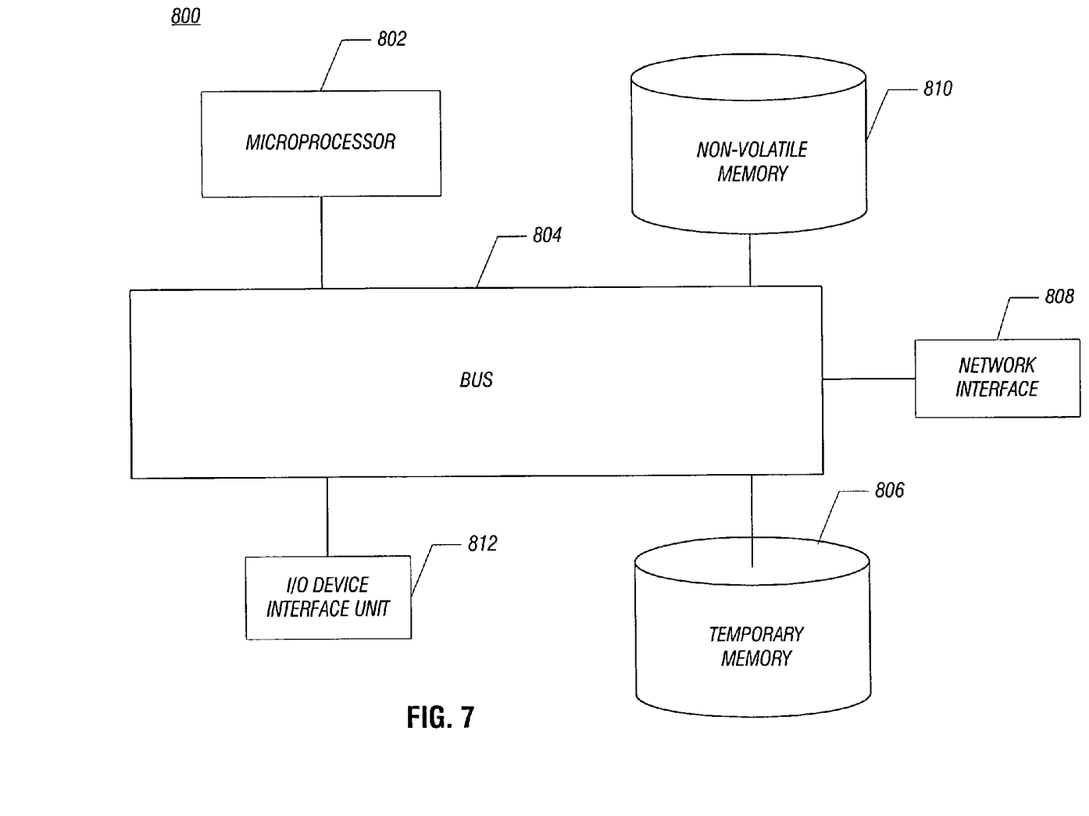
FIG. 7 is a block diagram of an example system, in accordance with some embodiments.

Referring now to FIG. 7, where a system 800 in accordance with some embodiments is shown. The system 800 includes a microprocessor 802 that may be coupled to a bus 804. The system 800 may further include temporary memory 806, a network interface 808, an optional non-volatile memory 810 and an input/output (I/O) device interface 812. In some embodiments, the input/output device interface unit 812 may be a keyboard, a cursor control device and/or other I/O device. One or more of the above enumerated elements, such as microprocessor 802, temporary memory 806, non-volatile memory 810, and so forth, may be coupled to the novel circuit board apparatuses described above.

One or more of the system components may be located on a single chip such as a system on chip (SOC). In various embodiments, the system 800 may be a personal digital assistant (PDA), a wireless mobile phone, a tablet computing device, a laptop computing device, a desktop computing device, a set-top box, an entertainment control unit, a digital camera, a digital video recorder, a media recorder, a media player, a CD player, a DVD player, a network server, or device of the like.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   an integrated circuit package substrate;
   a printed circuit board;
   a first socket electrically coupled between said integrated circuit package substrate and said printed circuit board; and
   a flex circuit coupled to said integrated circuit package substrate between said printed circuit board and said integrated circuit package substrate, said flex circuit including a second socket and microscale springs to electrically couple said flex circuit to said integrated circuit package substrate, said first socket including a keyed gap and said second socket is mounted in said keyed gap within said first socket, coplanar with said first socket.

2. The apparatus of claim 1 wherein said microscale springs include wire bonds.

3. The apparatus of claim 1 wherein said microscale springs have a pitch of less than or equal to about 500 microns.

4. The apparatus of claim 1 including a spacer between said flex circuit and said printed circuit board.

5. The apparatus of claim 2 wherein said spacer is elastomeric.

6. A method comprising:
   electrically coupling a first socket between an integrated circuit package substrate and a printed circuit board, said first socket having a keyed gap;
   coupling a flex circuit between said printed circuit board and said integrated circuit package substrate, said flex circuit having a second socket and microscale springs;
   electrically coupling said microscale springs of said flex circuit to said integrated circuit package substrate;
   mounting said second socket in said keyed gap within said first socket, coplanar with said first socket.

7. The method of claim 6 including providing microscale springs at a pitch of less than or equal to 500 microns.

8. The method of claim 6 including mounting said integrated circuit package substrate over said printed circuit board and positioning said flex circuit between said integrated circuit package substrate and said printed circuit board so that said microscale springs extend upwardly from said flex circuit to said integrated circuit package substrate.

9. The method of claim 6 wherein using microscale springs involves using microscale springs having wire bonds.

10. The method of claim 9 including using microscale springs to electrically couple said flex circuit to said integrated circuit package substrate.

11. The method of claim 7 including providing a spacer between said printed circuit board and said flex circuit.

12. The method of claim 11 including providing an elastomeric spacer between said flex circuit and said printed circuit board.

13. A system comprising:
- a processor;
- a package for said processor;
- a package substrate coupled to said processor;
- a first socket coupled to said package substrate; and
- a flex circuit electrically coupled to said package substrate, microscale springs to electrically couple said flex circuit to said package substrate, said flex circuit including a second socket, said first socket including a keyed gap and said second socket is mounted in said keyed gap within said first socket, coplanar with said first socket.

14. The system of claim 13 wherein said package substrate includes two opposed sides and said first socket and said flex circuit are attached on the same side.

15. The system of claim 13 including a printed circuit board coupled to said first socket.

* * * * *